United States Patent
Kahrs et al.

(10) Patent No.: US 9,780,270 B2
(45) Date of Patent: Oct. 3, 2017

(54) MOLDED LED LIGHT SHEET

(71) Applicant: Nthdegree Technologies Worldwide Inc., Tempe, AZ (US)

(72) Inventors: Eric William Kahrs, Phoenix, AZ (US); Bradley Steven Oraw, Chandler, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 122 days.

(21) Appl. No.: 14/292,069

(22) Filed: May 30, 2014

(65) Prior Publication Data

US 2014/0355251 A1 Dec. 4, 2014

Related U.S. Application Data

(60) Provisional application No. 61/830,861, filed on Jun. 4, 2013.

(51) Int. Cl.
*G09F 13/04* (2006.01)
*H01L 33/58* (2010.01)
(Continued)

(52) U.S. Cl.
CPC ............ *H01L 33/58* (2013.01); *F21K 9/65* (2016.08); *F21V 33/0052* (2013.01);
(Continued)

(58) Field of Classification Search
CPC .... F21K 9/58; F21V 33/0052; H01L 25/0753; H01L 33/58; H01L 2224/32245; H01L 2924/0002
(Continued)

(56) References Cited

U.S. PATENT DOCUMENTS 8,338,839 B2* 12/2012 Lerman .............. H01L 25/0753
257/100
8,783,915 B2* 7/2014 Xu ......................... H01L 33/54
362/330
(Continued)

FOREIGN PATENT DOCUMENTS

WO 2007149362 A2 12/2007
WO WO2007149362 * 12/2007 ....... G02F 1/133603

OTHER PUBLICATIONS

PCT/US2014/040484, "International Search Report and Written Opinion", dated Nov. 25, 2014, 15 pages.

*Primary Examiner* — Elmito Breval
*Assistant Examiner* — Jessica M Apenteng
(74) *Attorney, Agent, or Firm* — Patent Law Group LLP; Brian D. Ogonowsky

(57) ABSTRACT

An initially flat light sheet is formed by printing conductor layers and microscopic LEDs over a flexible substrate to connect the LEDs in parallel. The light sheet is then subjected to a molding process which forms 3-dimensional features in the light sheet, such as bumps of any shape. The features may be designed to create a desired light emission profile, increase light extraction, and/or create graphical images. In one embodiment, an integrated light sheet and touch sensor is formed, where the molded features convey touch positions of the sensor. In one embodiment, a curable resin is applied to the light sheet to fix the molded features. In another embodiment, optical features are molded over the flat light sheet. In another embodiment, each molded portion of the light sheet forms a separate part that is then singulated from the light sheet.

20 Claims, 8 Drawing Sheets

(51) Int. Cl.
*F21V 33/00* (2006.01)
*H01L 25/075* (2006.01)
*F21K 9/65* (2016.01)

(52) U.S. Cl.
CPC ..... *H01L 25/0753* (2013.01); *H01L 2224/32245* (2013.01); *H01L 2924/0002* (2013.01)

(58) Field of Classification Search
USPC ........................................................ 362/97.1
See application file for complete search history.

(56) References Cited

U.S. PATENT DOCUMENTS

| | | | |
|---|---|---|---|
| 2005/0214963 A1* | 9/2005 | Daniels | H01L 24/29 438/29 |
| 2006/0097059 A1* | 5/2006 | Miyazaki | G06K 19/0718 235/492 |
| 2008/0123355 A1 | 5/2008 | Wuu et al. | |

\* cited by examiner

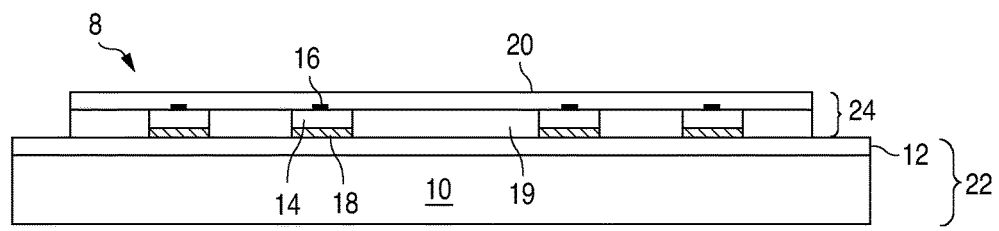
FIG. 1
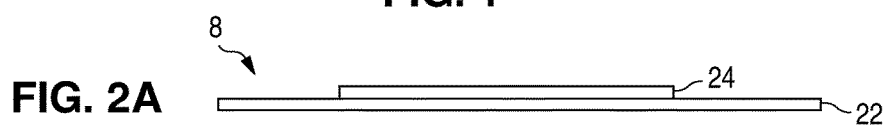
FIG. 2A
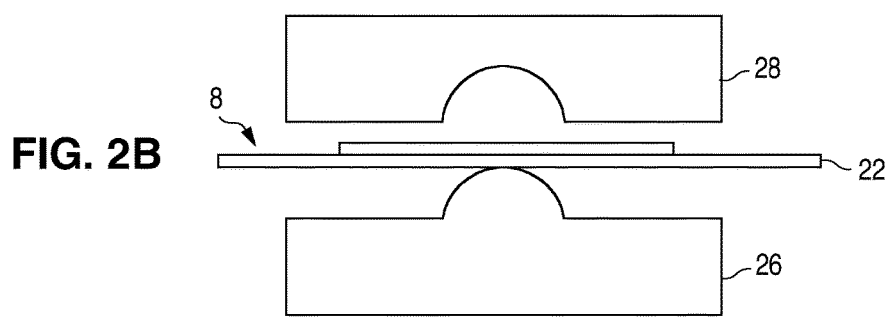
FIG. 2B
FIG. 2C
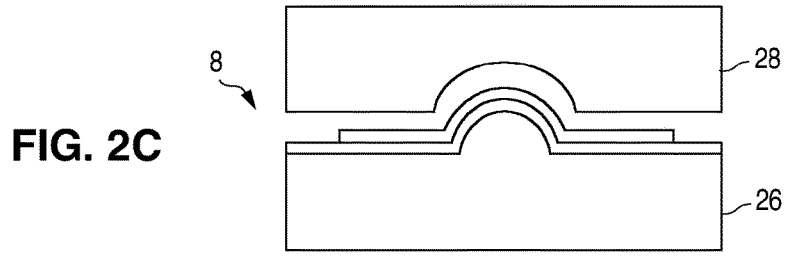
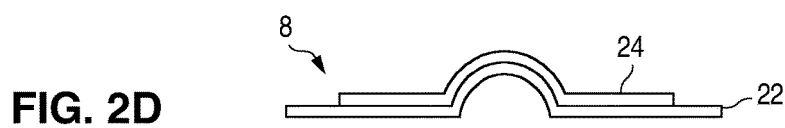
FIG. 2D

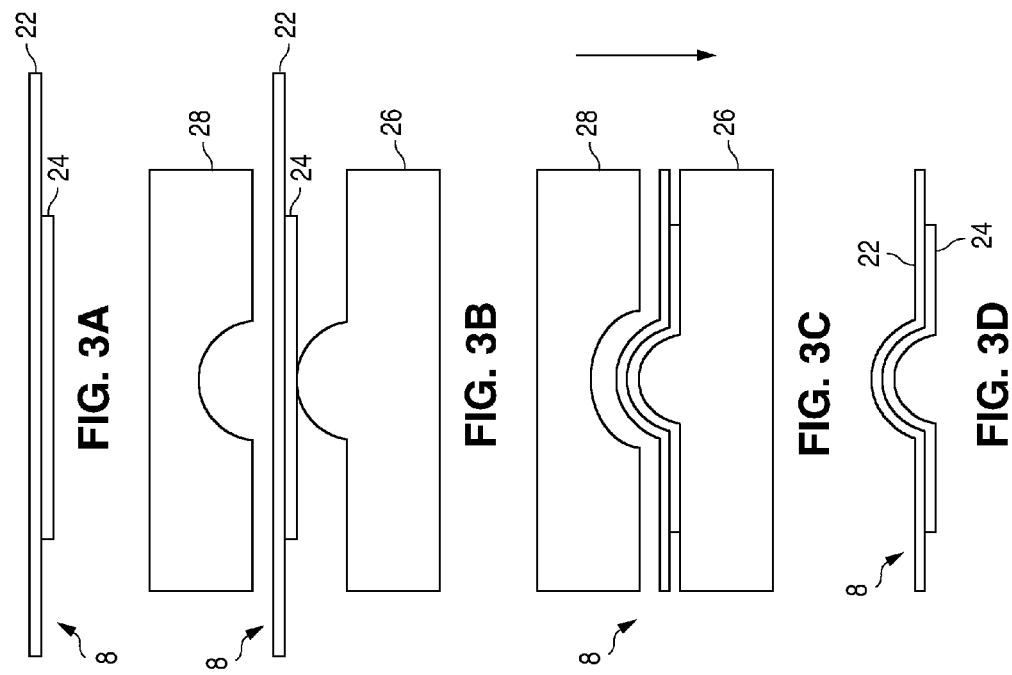

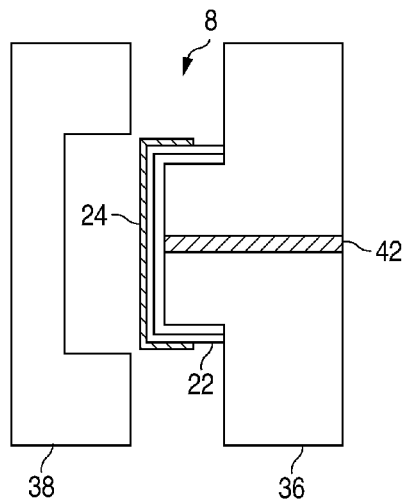
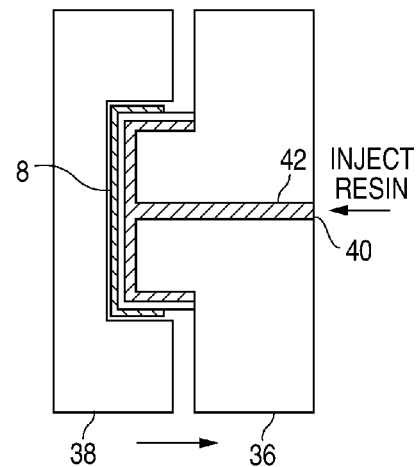
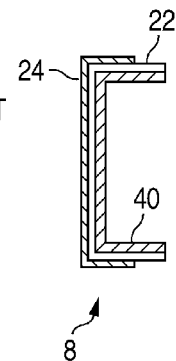
FIG. 5A      FIG. 5B      FIG. 5C
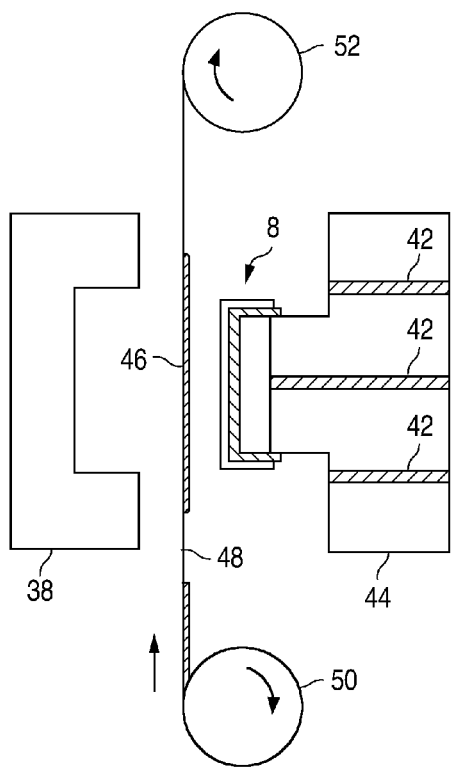
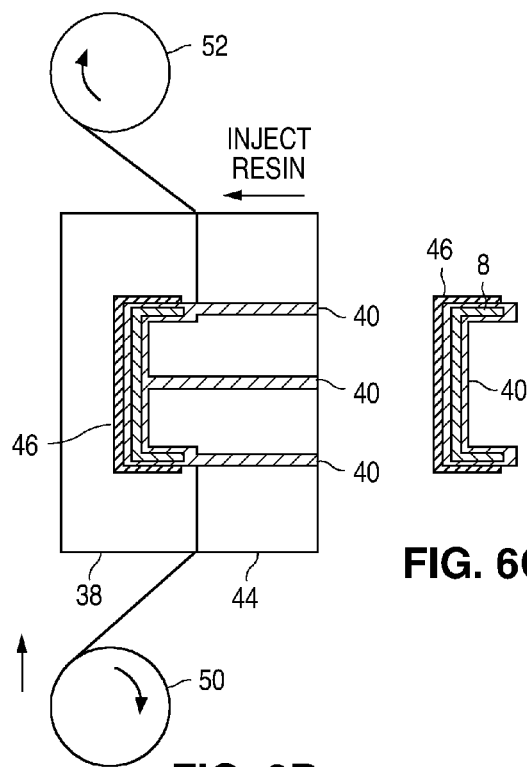
FIG. 6A      FIG. 6B      FIG. 6C

MOLDED LED LIGHT SHEET

CROSS-REFERENCE TO RELATED APPLICATIONS

This application is based on U.S. provisional application Ser. No. 61/830,861, filed Jun. 4, 2013, by Eric William Kahrs et al., assigned to the present assignee and incorporated herein by reference.

FIELD OF THE INVENTION

This invention relates to forming a light emitting diode (LED) lamp and, in particular, to forming a thin, flat LED light sheet and then molding the light sheet to have 3-dimensional features.

BACKGROUND

LED lamps greatly reduce operating cost compared to incandescent lamps, are more pleasing than fluorescent lamps, and have a very long life.

The present assignee has previously invented a flat light sheet formed by printing microscopic vertical LED dies over a conductor layer on a flexible substrate to electrically contact the LED's bottom electrodes, then printing a thin dielectric layer over the conductive layer which exposes the LED's top electrodes, then printing another conductor layer to contact the LED's top electrodes. The LED dies are printed to have the same orientation, such as anode electrodes up. The LEDs are thus connected in parallel. By applying a correct polarity voltage across the conductor layers, the LEDs are illuminated. By using a transparent film as the substrate and making either or both of the conductor layers transparent, light may exit through either surface or both surfaces simultaneously. If the LEDs are GaN-based and emit blue light, a phosphor layer (e.g., YAG) may be deposited over the light emitting surface to cause the light sheet to emit any color light, such as white light. The light sheets may be formed to have a thickness less than 2 mm.

Further detail of forming a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

Paragraph 0435 of the publication US 2012/0164796 describes how the flexible light sheet "may be curled, folded, twisted, spiraled, flattened, knotted, creased, and otherwise shaped into any of various forms and designs, of any kind, including architectural shapes, folded and creased origami shapes of other artistic or fanciful designs, Edison bulb shapes, fluorescent bulb shapes, chandelier shapes, for example and without limitation, . . . ". As seen, the publication describes how the various shapes are achieved by some sort of bending of the light sheet and, since the light sheet is somewhat resilient, the resulting shape must be retained by some sort of external support structure, such as an Edison base.

The above-quoted disclosed uses of the flexible light sheet are still limited since fine 3-dimensional shapes could not be made using the disclosed techniques. For example, the light sheet could not be folded to produce an array of rounded bumps that change the emission profile and/or increase light extraction. Additionally, it would be desirable to provide a light sheet having 3-dimensional features where the features are not required to be retained by an external support structure. Additionally, it would be desirable to form the fine 3-dimensional features without the various layers of the light sheet delaminating from each other.

SUMMARY

In one embodiment, a light sheet is formed by printing an array of microscopic LED dies over a first conductor layer supported by a thin flexible substrate. The bottom electrodes (e.g., cathode electrode) of the LED dies electrically contact the first conductor layer. A dielectric layer is printed over the first conductor layer. A second conductor layer is deposited over the top electrodes (e.g., anode electrodes) of the LED dies to electrically contact the top electrodes. The light sheet can emit light from its top or bottom surface by using a transparent substrate and transparent conductor layers.

The layer materials are selected to be moldable without any adverse effects, and the molded shape remains without any external structure. The layers are preferably as thin as practical to avoid delamination due to tensile and compression stresses upon deformation of the light sheet.

A suitable mold press is provided, and the light sheet is pressed between the opposing mold portions. The press may be a cold press or a heated press. In one embodiment, the mold forms an array of rounded bumps in the light sheet, where each bump widely spreads the light. Besides spreading the light, the bumps increase light extraction due to there being less wave-guiding in the light sheet due to total internal reflection (TIR). The bumps may also be used to collimate the light from the light sheet, depending on whether the LEDs emit from the convex side or the concave side of the bumps. This reduces glare when the molded light sheet is used as an overhead light for general illumination of a room.

In another embodiment, to help the molded light sheet retain its shape, the non-emitting surfaces of the molded areas are coated or filled with an injected resin (or other suitable material) as part of the molding process.

The formation of the light sheet, and the molding and resin filling processes, can be carried out in a continuous roll-to-roll process.

In one embodiment, the molding may be used to form raised alpha-numeric characters that are backlit by the LEDs, such as for identifying touch positions on an integrated capacitive touch pad.

In another embodiment, opaque patterns, such as negatives of alpha-numeric characters, may be printed on the flat light sheet, then a mold is aligned with the opaque pattern to form a raised pattern in the light sheet consistent with the opaque pattern.

Many variations of the above embodiments are contemplated and described.

BRIEF DESCRIPTION OF THE DRAWINGS

FIG. 1 is a cross-section of a thin light sheet with an array of vertical LEDs sandwiched between two conductor layers to connect the LEDs in parallel, in accordance with one embodiment of the invention.

FIG. 2A is a simplified cross-sectional view of the light sheet of FIG. 1 prior to a molding step FIG. 2B illustrates male and female molds being positioned above and below the light sheet of FIG. 2A. The molds may be at room temperature or heated.

FIG. 2C illustrates the molds being brought against the light sheet to form it.

FIG. 2D illustrates the resulting molded light sheet. The light sheet may contain a large array of such bumps.

FIGS. 3A-3D illustrate the same process as FIGS. 2A-2D except the light sheet of FIG. 1 is substrate-side up in the mold.

FIGS. 4A-4E illustrate a hot-form process that only requires a male mold. A vacuum pulled from small holes in the mold or a high air pressure pushing down on the light sheet may be used to cause the light sheet to form around the male mold.

FIGS. 5A-5C illustrate a molding process, where a shape-retaining resin is injected to maintain the shape of the molded light sheet.

FIGS. 6A-6C illustrate a roll-to-roll lamination process performed during a light sheet molding process.

FIG. 14 is taken along line 14-14 in FIG. 15.

Elements that are similar or identical in the various figures are labeled with the same numeral.

DETAILED DESCRIPTION

Figure 7A:
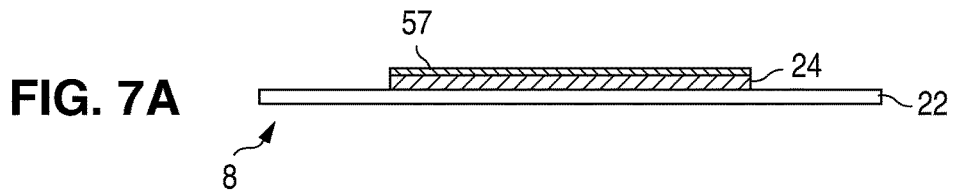
FIGS. 7A-7C illustrate a light sheet with a phosphor layer being molded in a hot molding process.

In one embodiment of the invention, a thin light sheet containing microscopic LED dies is molded to have any type of 3-dimensional features, such as an array of bumps for increasing light extraction and/or for creating a desired light emission profile. In another embodiment, the light sheet is molded to correspond to alpha-numeric characters or any other design. In another embodiment, the light sheet forms a backlight of a thin touch sensor, and the backlit touch sensor is molded to convey alpha-numeric characters or any other design. By using microscopic LEDs, the LEDs will not detach from their conductor layer when the light sheet is bent by molding. Other embodiments are disclosed.

In FIG. 1, a starting substrate 10 may be polycarbonate, PET (polyester), PMMA, Mylar or other type of polymer sheet, or even a thin metal film. In one embodiment, the substrate 10 is about 25-50 microns thick.

A conductor layer 12 is then deposited over the substrate 10, such as by printing. The substrate 10 and/or conductor layer 12 may be reflective if the light from the LEDs is to only be emitted from the opposite side. For example, the conductor layer 12 may be a printed aluminum layer or a laminated aluminum film. Alternatively, a reflective layer may be first laminated over the substrate 10 followed by printing a transparent conductor layer 12 over the reflective film. A reflective film, including a white diffusing paint, may also be provided on the back surface of the substrate 10. A suitable transparent conductor layer 12 may be a silver nano-wire layer since such a layer is highly flexible.

A monolayer of microscopic inorganic LEDs 14 is then printed over the conductor layer 12. The LEDs 14 are vertical LEDs and include standard semiconductor GaN layers, including an n-layer, and active layer, and a p-layer.

The GaN-based micro-LEDs used in embodiments of the present invention are less than a third the diameter of a human hair and less than a tenth as high, rendering them essentially invisible to the naked eye when the LEDs are sparsely spread across the substrate 10 to be illuminated. This attribute permits construction of a nearly or partially transparent light-generating layer made with micro-LEDs. In one embodiment, the LEDs 14 have a diameter less than 50 microns and a height less than 10 microns. The number of micro-LED devices per unit area may be freely adjusted when applying the micro-LEDs to the substrate 10. A well dispersed random distribution across the surface can produce nearly any desirable surface brightness. Lamps well in excess of 10,000 $cd/m^2$ have been demonstrated by the assignee. The LEDs may be printed as an ink using screen printing or other forms of printing. Further detail of forming a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

In one embodiment, an LED wafer, containing many thousands of vertical LEDs, is fabricated so that the top metal electrode 16 for each LED is small to allow light to exit the top surface of the LEDs. The bottom metal electrode 18 is reflective (a mirror) and should have a reflectivity of over 90% for visible light. There is some side light, depending on the thickness of the LED. In the example, the anode electrode is on top and the cathode electrode is on the bottom. In other embodiments, the top electrode may cover the entire surface of the LED and is reflective, and light exits the bottom of the LED through a transparent conductor layer 12 and a transparent substrate 10. In another embodiment, the electrodes are formed so that light exits both surfaces, and the lamp emits light though both surfaces of the light sheet.

The LEDs are completely formed on the wafer, including the anode and cathode metallizations, by using one or more carrier wafers during the processing and removing the growth substrate to gain access to both LED surfaces for metallization. After the LEDs are formed on the wafer, trenches are photolithographically defined and etched in the front surface of the wafer around each LED, to a depth equal to the bottom electrode, so that each LED has a diameter of less than 50 microns and a thickness of about 4-8 microns, making them essentially invisible to the naked eye. A preferred shape of each LED is hexagonal. The trench etch exposes the underlying wafer bonding adhesive. The bonding adhesive is then dissolved in a solution to release the LEDs from the carrier wafer. Singulation may instead be performed by thinning the back surface of the wafer until the LEDs are singulated. The LEDs 14 of FIG. 1 result, depending on the metallization designs. The microscopic LEDs 14 are then uniformly infused in a solvent, including a viscosity-modifying polymer resin, to form an LED ink for printing, such as screen printing, or flexographic printing.

The LEDs 14 may instead be formed using many other techniques and may be much larger or smaller. The lamps described herein may be constructed by techniques other than printing.

The LED ink is then printed over the conductor layer 12. The orientation of the LEDs 14 can be controlled by providing a relatively tall top electrode 16 (e.g., the anode electrode), so that the top electrode 16 orients upward by taking the fluid path of least resistance through the solvent after printing. The anode and cathode surfaces may be opposite to those shown. The LED ink is heated (cured) to evaporate the solvent. After curing, the LEDs remain attached to the underlying conductor layer 12 with a small amount of residual resin that was dissolved in the LED ink as a viscosity modifier. The adhesive properties of the resin and the decrease in volume of resin underneath the LEDs 14 during curing press the bottom cathode electrode 18 against the underlying conductor layer 12, creating a good electrical connection. Over 90% like orientation has been achieved, although satisfactory performance may be achieved with over 75% of the LEDs being in the same orientation.

A dielectric layer 19 is then selectively printed over the conductor layer 12 to encapsulate the sides of the LEDs 14 and further secure them in position. The ink used in the dielectric layer 19 pulls back from the upper surface of the LEDs 14, or de-wets from the top of the LEDs 14, during curing to expose the top electrodes 16. If any dielectric remains over the LEDs 14, a blanket etch step may be performed to expose the top electrodes 16.

A transparent conductor layer 20 is then printed to contact the top electrodes 16. The conductor layer 20 may be ITO or may include silver nano-wires. The conductor layer 20 is cured by lamps to create good electrical contact to the electrodes 16. Since ITO is relatively brittle and the resulting light sheet will be molded, it is preferred to use a cured silver nano-wire solution to form the transparent conductor layer 20. The curing sinters overlapping silver nano-wires together to form a flexible 3-dimensional mesh of wires have large openings for allowing light to pass through.

The LEDs 14 in the monolayer, within a defined area, are connected in parallel by the conductor layers 12/20 since the LEDs 14 have the same orientation. Since the LEDs 14 are connected in parallel, the driving voltage must approximately equal the voltage drop of a single LED 14.

Many other ways can be used to form the LEDs 14, and the LEDs 14 do not need to be microscopic or printed for the present invention to apply.

A flexible, protective layer (not shown) may be printed over the transparent conductor layer 20. A phosphor layer (not shown) may be printed over the surface before or after the below-described molding step. The phosphor layer may comprise phosphor powder (e.g. a YAG phosphor) in a flexible binder, such as silicone.

The flexible light sheet 8 of FIG. 1 may be any size and may even be a continuous sheet formed during a roll-to-roll process.

FIGS. 2A-2D illustrate a molding process for the light sheet 8 of FIG. 1. The flat light sheet 8 of FIG. 2A is simplified to show only the substrate 10/conductor layer 12 portion 22 and the LED 14/dielectric layer 19/conductor layer 20 portion 24.

FIG. 2B illustrates a male mold 26 and a female mold 28 being positioned above and below the light sheet 8 of FIG. 2A. The molds 26/28 may be at room temperature or heated. The molds 26/28 may mold any 3-dimensional relief pattern in the light sheet 8 and a single large bump is shown for simplicity.

The molds 26/28 may be metal, plastic, or any other rigid material. The molds 26/28 are aligned with the light sheet 8, such as with registration holes or markings in the light sheet 8 and, as shown in FIG. 2C, the molds 26/28 are brought together to press against the light sheet 8 with sufficient pressure to permanently distort the light sheet 8. The molds 26/28 may be heated, if necessary, to form the permanent pattern in the light sheet 8. In another embodiment, the molds 26/28 are at room temperature.

FIG. 2D illustrates the resulting molded light sheet 8.

Since the light-generating portion 24 is the convex side and the substrate portion 22 is the concave side, the portion 24 is under tensile strain, while the portion 22 is under compressive strain. Depending on the materials used, one of the portions may withstand tensile strain or compressive strain better than the other portion. Therefore, this may be a consideration when deciding which portion is the convex side and which portion is the concave side. The mold shape is also designed to not adversely affect the operation of the layers after molding.

A layer of phosphor may be printed over the molded light sheet.

In one embodiment, the light sheet 8 may contain a large array of such molded bumps, such as generally hemispherical bumps with a diameter of about 1 cm and a pitch (from center to center) of 1 cm or greater. The height of a bump may be, for example, 2 mm. The bumps not only cause light to spread at a wide angle, but reduce waveguiding in any transparent layer, such as the dielectric layer 19, transparent conductor layer(s) 12/20, or transparent substrate 10. Waveguiding is reduced by the bumps causing more light to impinge on the material interfaces at less than the critical angle to avoid total internal reflection (TIR). Such increase in light extraction would occur with any size bumps, whether or not any LEDs 14 were located in the bumps.

In the example of FIG. 2D, the LED layer is in the top portion 24, and assuming there is a reflector layer "below" the LEDs, the light is emitted at a very wide angle from the round surfaces of the bumps, assuming there is a 2-dimensional array of bumps formed. The bumps may form an ordered array or a random array. The bumps may be any shape, including rectangular or more complex designs such as characters.

FIGS. 3A-3D illustrate the same molding process as FIGS. 2A-2D, but the light sheet 8 is positioned between the molds 26/28 so that the portion 24 containing the LED layer is the bottom layer, forming a concave shape in FIG. 3D. As a result, assuming there is a reflective layer between the LEDs and the substrate, the LED light will be focused by the bumps to create bright spots. The bumps may generally form parabolic reflectors to collimate the LED light, where the combination of all the collimated beams result in an overall collimated light output of the molded light sheet. If the bumps are sufficiently small and close together, the collimated beams will merge.

The bumps of FIG. 3D may even be used to reduce glare by direct viewing of the light sheet 8 at an angle, such as when the light sheet 8 is used as an overhead light for illumination of a room or automobile. The depth of each bump may be designed to limit glare to a specified angle for meeting lighting standards, where the greater the depth, the less glare. In contrast, the bump of FIG. 2D would generally increase glare.

The materials used in the light sheet 8 may generally retain the molded shape if sufficient pressure is used to permanently distort the layers. Some resiliency may be tolerable. However, if the molded shape contained fine features or sharp angles, a hot mold may be required to soften the light sheet 8 during molding to reduce stresses in the layers. FIGS. 4A-4E illustrates a hot mold process. In all embodiments, the orientation of the light sheet 8 may be reversed.

In FIG. 4A, the flat light sheet 8 is provided.

In FIG. 4B, a heatable male molding tool 32 is provided. The tool 32 may have a cylindrical shape or a rectangular prism shape, such as for emulating a button for touching.

In FIG. 4C, the light sheet 8 is positioned over the heated tool 32. The tool 32 may be provided with small air holes for drawing the light sheet 8 against the tool 32 by vacuum, or a heated blower above the light sheet 8 may press the light sheet 8 against the tool 32, or a soft press may urge the light sheet 8 against the tool 32 while conforming to the tool 32. The tool 32 itself may be heated, or the molding step may be performed in a hot atmosphere such as by applying hot air or radiant energy to the light sheet 8.

In FIG. 4D, the light sheet 8 is cooled and removed from the tool 32.

If the tool 32 is designed to form an individual part, such as a 3-dimensional alpha-numeric character, the molded light sheet 8 may be trimmed, such as by stamping, to singulate the molded portion. In such a case, a single tool may have an array of the mold structures, and a large light sheet may be molded in a single step to form an array of the parts. The parts are then singulated from the light sheet. Conductors for the LEDs may extend to the ends of the singulated part for connection to a power supply.

FIGS. 5A-5C illustrate another type of molding process that causes the light sheet 8 to retain its molded shape, even with a cold mold process.

In FIG. 5A, the flat light sheet 8 is pressed between a male mold 36 and a female mold 38 and held between the molds to shape the light sheet 8. The molds 36/38 may define an array of the relief features, and the designs may take any shape.

In FIG. 5B, a liquid resin 40 is injected into the mold to adhere to the shaped light sheet 8. The mold 36 has one or more channels 42 leading to the light sheet 8, and the pressure of the resin 40 may be used to form a gap between the light sheet 8 and the mold 36 which is filled by the resin 40. A precise amount of resin 40 is injected. The resin 40 may form a layer or entirely fill the concave portion of the feature. The resin 40 is then cured, while the mold is still applying pressure to the light sheet 8, to harden the resin 40. Curing may be done by heating, cooling, or by UV, depending on the type of resin 40 used. The resin 40 may be opaque or transparent. Other materials may be used.

In FIG. 5C, the shaped light sheet 8 and hardened resin 40 layer is removed from the mold. The molded portions may be singulated from the light sheet.

FIGS. 6A-6C illustrate a roll-to-roll lamination process that may be used in conjunction with a molding process similar to that of FIGS. 5A-5C. Additionally, the light sheet 8 molding process may be simultaneously performed in a coordinated roll-to-roll process.

In FIG. 6A, the flat light sheet 8 is positioned between the molds 38 and 44. A capacitive touch sensor layer may also be formed over the layer of LEDs/conductors or laminated over the light sheet 8 to form a backlit touch sensor. A layer 46 to be laminated over the light sheet 8 is provided on a substrate 48. The substrate 48/layer 46 is supplied by a supply roll 50 and, after the lamination, the substrate 48 is taken up by a take-up roll 52. The layer 46 may be a patterned opaque film for defining an emitted light pattern of the light sheet 8, or may be a thin touch sensor layer, or may be any other layer or layers.

At the same time that the light sheet 8 is being molded, the substrate 48/layer 46 is brought against the surface of the light sheet 8 by the pressure of the molds 38/44. The layer 46 may include an adhesive or is formed of a material that adheres to the surface of the light sheet 8 when heated. The adhesion to the light sheet 8 is greater than the adhesion to the substrate 48.

As shown in FIG. 6B, while the mold is closed, resin 40 is injected through the channels 42 and cured to cause the molded light sheet 8 to retain its shape.

In FIG. 6C, the mold is opened, and the substrate 48 is pulled away from the layer 46 so the layer 46 remains fixed over the light sheet 8. The layer 46 may be a negative of an alpha-numeric character so that light from the light sheet 8 is emitted in the shape of the character or other design. If a transparent touch sensor is also included in the layers, the light sheet 8 backlights the touch sensor to identify touch positions, such as a key pad with the numerals 0 through 9.

In an alternative embodiment, the graphics are printed directly on the flat light sheet 8 prior to the molding step.

Figure 7B:
Figure 7C:
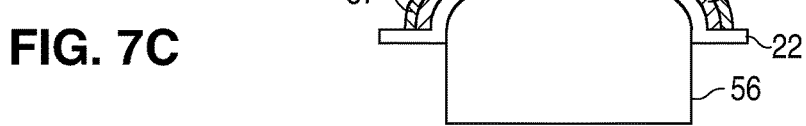

FIGS. 7A-7C illustrate a process similar to FIGS. 4A-4C, where the light sheet 8 is positioned over a curved molding tool 56. A phosphor layer 57 is formed over the LED layer prior to molding. The light sheet 8 is then pressed against the tool 56, such as by air pressure or a deformable press tool, while the light sheet 8 is heated. The tool 56 itself may be heated or the light sheet 8 is heated by air or by radiant heating to soften it. This causes the light sheet 8 to retain the molded shape when cooled and alleviates stresses on the layers. The resulting shape forms bumps of any size and number. This may be used to create a desired light emission profile and/or increase light extraction, as previously described. The relief pattern may also provide a desired tactile feel if the light sheet 8 is integrated into a touch sensor. An array of small bumps may be formed across the entire light sheet 8. Instead of bumps, the tool 56 may form other designs, such as alpha-numeric characters.

Figure 8A:
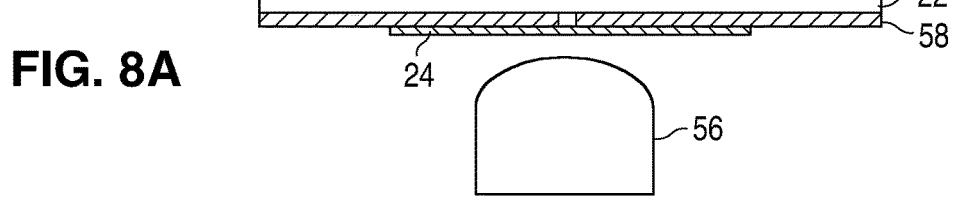
FIGS. 8A-8C illustrate a light sheet having printed graphics being molded, where the mold is aligned with the graphics.
Figure 8B:
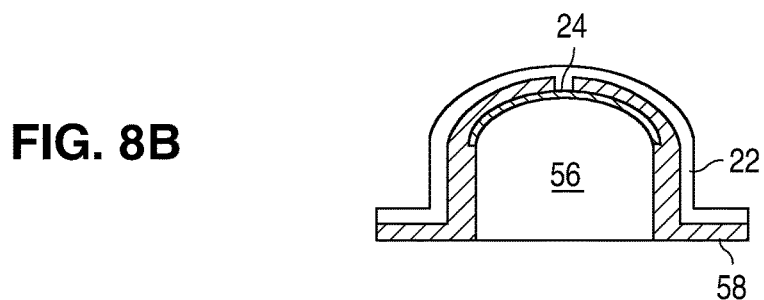
Figure 8C:
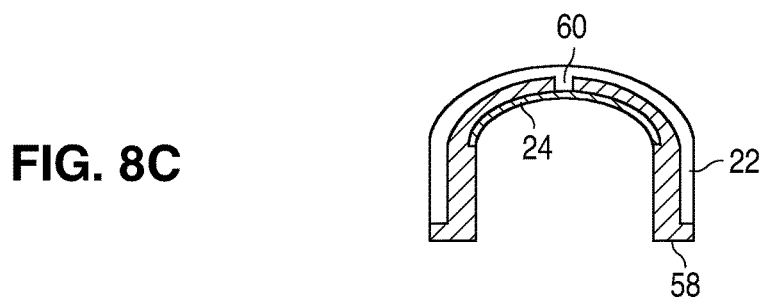

The process of FIGS. 8A-8C is similar to the process of FIGS. 7A-7C except the flat light sheet 8 also includes a patterned opaque graphics layer 58 printed between the LED layer and the substrate to selectively allow light to pass through. The sheet 8/58 is then molded by the mold tool 56 and heated, then cooled in FIG. 8B, so the sheet 8/56 retains the shape of the mold. After being released from the mold, in FIG. 8C, the formed sheet portion may be singulated for any use. In the cross-section of FIG. 8C, the light generated by the LEDs is only allowed to be emitted through the clear portion 60 in the graphics layer 58. The clear portion 60 may be part of an alpha-numeric character.

In all embodiments, the two conductor layers of the light sheet 8 may be provided with metal electrodes for receiving a voltage to illuminate the LEDs. These metal electrodes may be formed on the top or bottom of the light sheet 8, depending on the application. When the molded portion of the light sheet 8 is singulated and affixed to the final product, the metal electrodes on the light sheet 8 are connected to leads of a power supply. The manner of the connection depends on the particular application.

Figure 9:
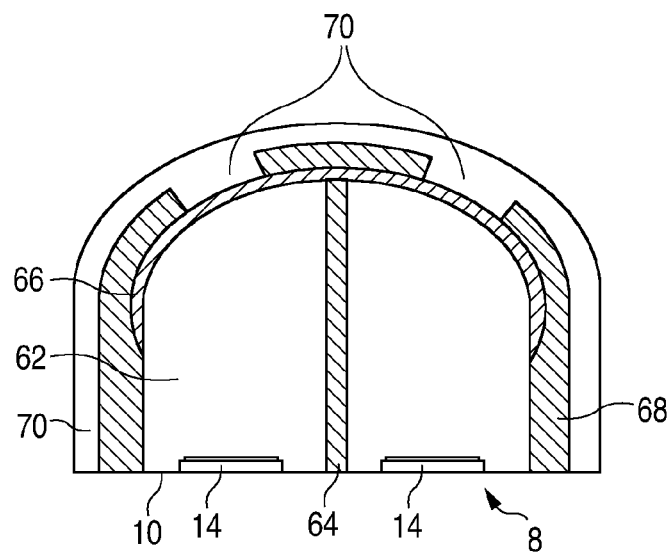
FIG. 9 is a close-up view of a portion of a light sheet having an optical feature molded over it, where the optical feature may include a molded opaque vertical partition, and where laminated layers may be provided over the molded optical feature, including a phosphor layer, an opaque graphic pattern, and a protective clear layer, such as to display an alpha-numeric character.

FIG. 9 is a close-up view of an optical feature that has been molded over the light sheet 8. Although two LEDs 14 are shown illuminating the optical feature, there may be many more LEDs 14 illuminating the optical feature. The optical feature is arbitrary to show various possibilities by molding over the light sheet 8.

In one embodiment, a transparent or diffusive resin 62, or other light emissive material, is injection molded over a portion of the light sheet 8. Many identical or different features can be injection molded at the same time over a portion of the light sheet 8 or over the entire light sheet 8 to form an array of the optical features.

The mold may simultaneously form an opaque partition 64 that bisects the optical feature.

Laminated or molded over the molded resin 62 is a phosphor layer 66 for converting the blue LED light to a different color, such as white. The LEDs 14 may emit any color, and a phosphor layer is optional.

Laminated or molded over the resin 62 and phosphor layer 66 is a patterned opaque graphics layer 68, such as for creating alpha-numeric characters for a touch sensor. The graphics layer 68 may be any opaque material, such as a binder infused with carbon powder.

Deposited over the optical feature is a clear polycarbonate layer 70. The layer 70 may be molded, sprayed on, printed on, etc. The polycarbonate layer 70 creates a hard covering over the light sheet 8 so that the molded features retain their shapes even when touched. Such a polycarbonate layer 70 may be used with any of the embodiments described herein. The phosphor-converted light exits through the openings in the graphics layer 68. By distancing the light emitting surface of the structure from the LEDs 14, the light from the LEDs 14 is better mixed and diffused to improve brightness uniformity and color uniformity across the light exit areas.

Figure 10:
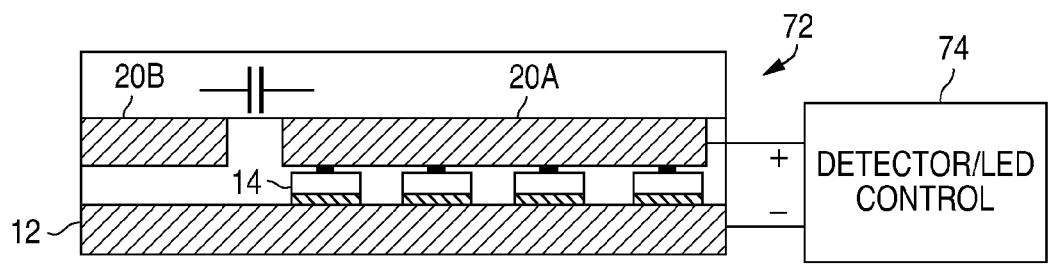
FIG. 10 is a cross-sectional view of a portion of a backlit touch sensor that may be molded, where the light sheet is integrated with the touch sensor by sharing conductors/electrodes.

One application for the molding of the light sheet 8, or the molded optical feature over the light sheet 8, is to form characters for a touch sensor input device, such as a keypad. FIG. 10 illustrates a portion of a backlit touch sensor 72. The transparent conductor layer 20A/20B is patterned to interconnect all or a subset of the printed LEDs 14 in parallel and also form the touch sensor electrode pattern. FIG. 10 only shows a single touch sensor position, and the sensor positions may be formed as an ordered array over an area, such as to correspond to the numbers 0-9. By a user touching an area within a sensor position, the capacitance between the transparent conductor portions 20A and 20B changes, and this change in capacitance is processed by a detector/LED control circuit 74 to identify the area touched. Further processing is then carried out to perform the function desired by the user. The different sensor positions may be rapidly scanned to detect the change in capacitance at any of the positions.

Figure 11:
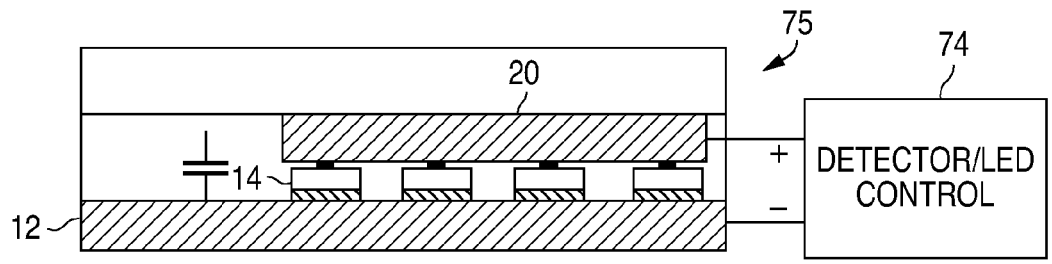
FIG. 11 is a cross-sectional view of a portion of another type of backlit touch sensor that may be molded, where the light sheet is integrated with the touch sensor by sharing conductors/electrodes.

FIG. 11 illustrates a single position of another type of backlit touch sensor 75, where the capacitance between the transparent conductor layer 20 and the bottom conductor layer 12 changes when the user touches the sensor in that area.

The LEDs 14 in the sensor may all be on to backlight the entire touch sensor, or only one or more areas of the sensor may be backlit to provide visual feedback to the user that a touch area has been sensed, or the sensor may only be backlit once any area has been touched. The particular application is determined by the processing of the sensor signals.

Figure 12:
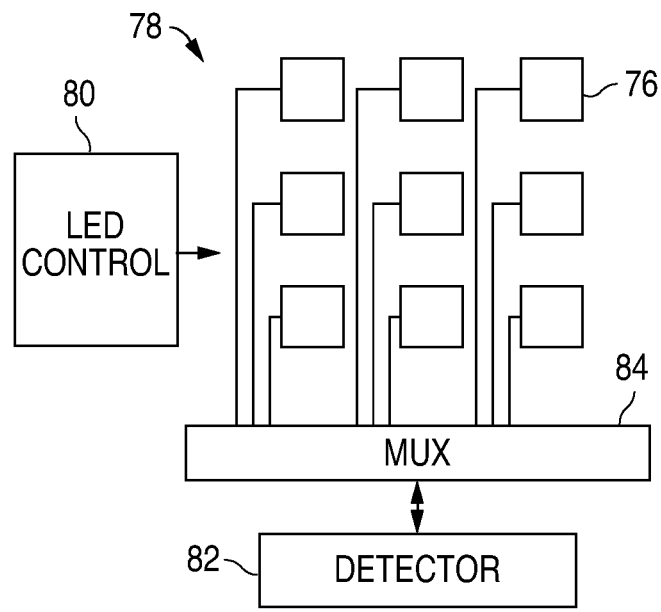
FIG. 12 illustrates a touch sensor electrode pattern that may be used in the molded, backlit touch sensor.

FIG. 12 illustrates a possible arrangement of the touch sensor electrodes 76 in a 10-position backlit touch sensor 78. The electrodes 76 may also serve as the conductor layer portions for the LEDs so the light sheet and the touch sensor are integrated. In another embodiment, the electrodes 76 are transparent conductors laminated over the LED light sheet, and the light sheet portion and touch sensor portion are independent. An LED control circuit 80 controls the LEDs, and a detector 82 and multiplexer 84 are used to sense a touched area of the sensor for further processing. The illumination of the LEDs may or may not be related to the touching of the sensor areas.

Figure 13:
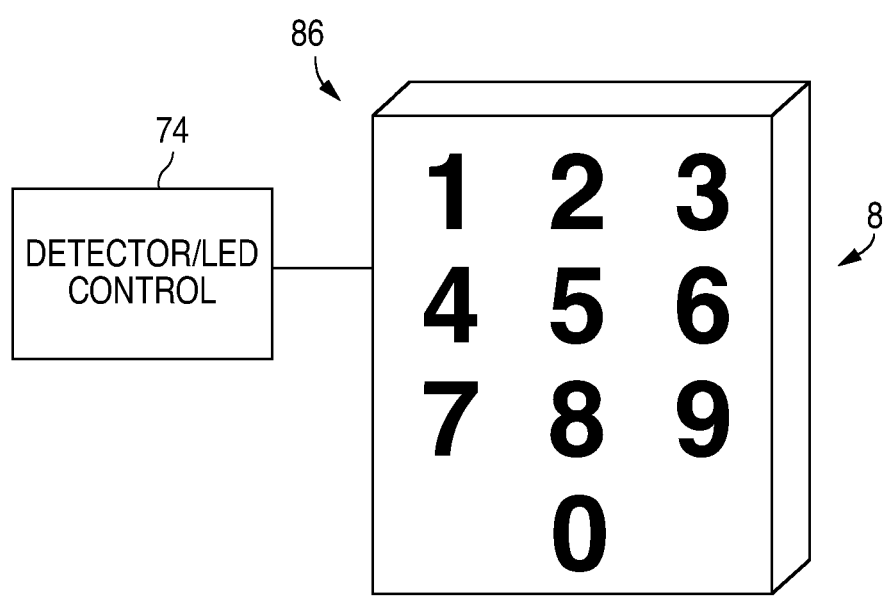
FIG. 13 is a front view of a backlight touchscreen sensor, where the touch positions are raised or indented molded portions to convey alpha-numeric characters.

FIG. 13 is a front view of a touch sensor keypad 86 for entering numbers. The numbers are raised portions of the light sheet 8 that are formed by any of the molding processes described herein. The numbers 0-9 may represent openings in an opaque graphic layer or may represent areas in which the LEDs are printed. The numbers may also represent recessed portions of the light sheet that concentrate the light.

Figure 14:
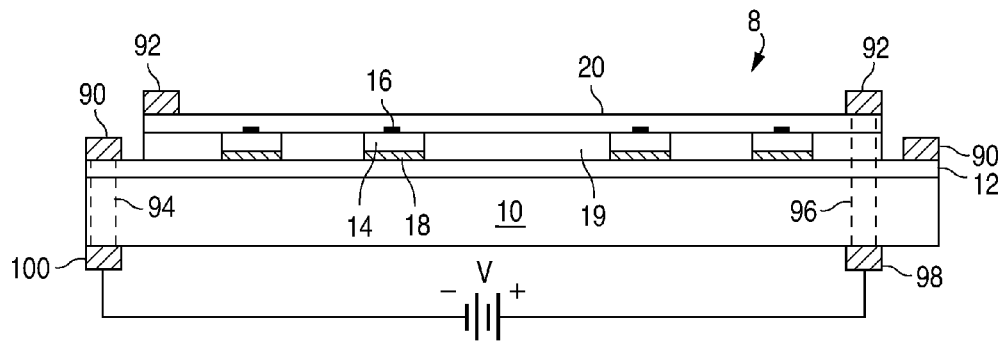
FIG. 14 is a cross-section of a light sheet after metal bus bars are formed for connection to a power supply.

FIG. 14 illustrates how the thin conductor layers 12 and 20 on the light sheet 8 may be electrically contacted along their edges by metal bus bars 90 and 92 that are printed and cured to electrically contact the conductor layers 12 and 20. The metal bus bars along opposite edges are shorted together by a printed metal portion outside of the cross-section. The structure may have one or more conductive vias 94 and 96 (metal filled through-holes), which form a bottom anode lead 98 and a bottom cathode lead 100 so that all electrical connections may be made from the bottom of the substrate 10. Instead of vias, the top metal may be connected to the bottom metal by other means, such as metal straps extending over the edges of the light sheet. A suitable voltage differential applied to the leads 98 and 100 turns on the LEDs 14 to emit light through one or both surfaces of the light sheet 8. The metal bus bars may be formed before or after the molding steps.

Figure 15:
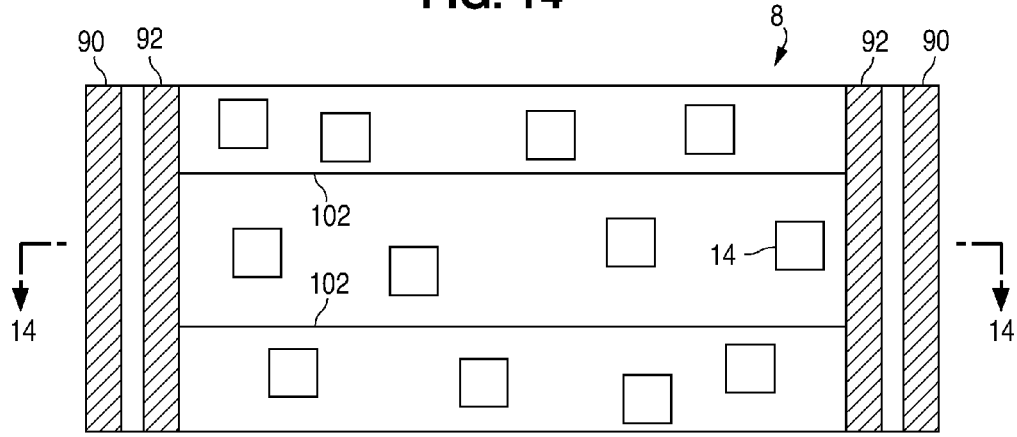
FIG. 15 is a top down view of the structure of FIG. 14, where

FIG. 15 is a top down view of the structure of FIG. 14, where FIG. 14 is taken along line 14-14 in FIG. 15. If the light sheet 8 is wide, there will be a significant IR drop across at least the transparent conductor layer 20. Thin metal runners 102 may be printed along the surface of the conductor layer 20 between the opposing bus bars 92 to cause the conductor layer 20 to have a more uniform voltage, resulting in more uniform current spreading. In an actual embodiment, there may be thousands of LEDs 14 in a light sheet 8.

The resulting structure may be less than 1 mm thick or thicker if greater rigidity is desired.

Figure 16:
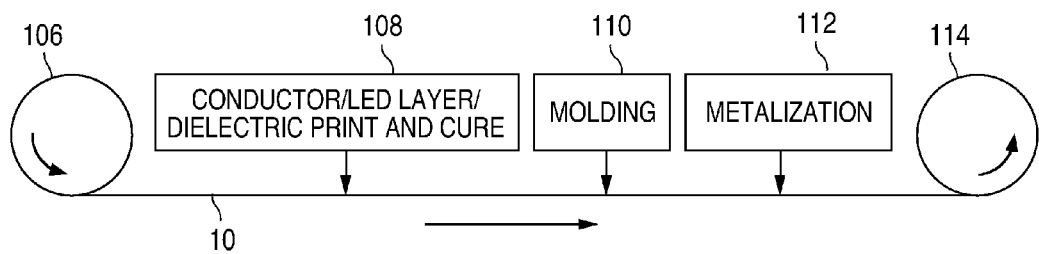
FIG. 16 illustrates a roll-to-roll process, performed under atmospheric pressure, used to form any of the molded embodiments described herein.

FIG. 16 illustrates a roll-to-roll process for forming the entire light sheet 8 having molded portions. The flexible substrate 10, which may or may not have a laminated conductor layer, is supplied on a supply roll 106. The various light sheet 8 layers are then printed and cured at the station 108. The molding is performed downstream at a molding station 110, and any metallization is performed at a metallization station 112. The resulting sheet is then taken up by a take-up roll 114, or alternatively, the finished sheets are singulated.

Figure 17:
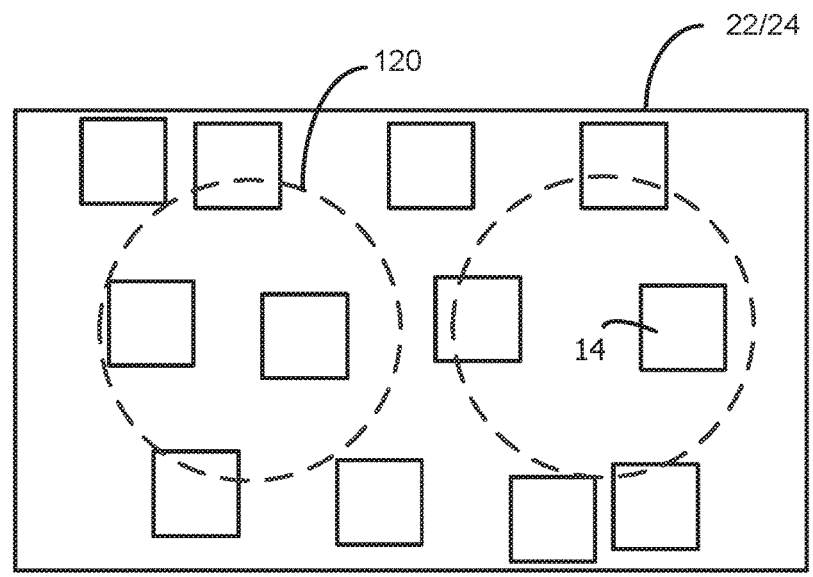
FIG. 17 illustrates the light sheet portion of FIG. 15 with an array of molded bumps (only two are shown in dashed outline) superimposed over the LEDs.

FIG. 17 illustrates the light sheet portion of FIG. 15 with an array of molded bumps 120 (only two are shown in dashed outline) superimposed over the LEDs 14.

Figure 18:
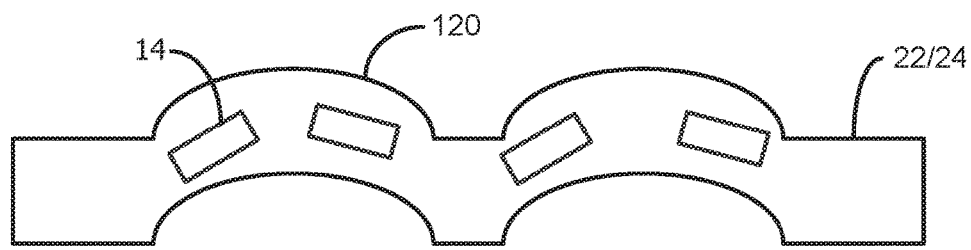
FIG. 18 is a bisected view of FIG. 17 showing only the top and bottom surfaces of the light sheet, illustrating the convex and concave molded bumps.

FIG. 18 is a bisected view of FIG. 17 showing only the top and bottom surfaces of the light sheet, illustrating the convex and concave molded bumps 120.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An illumination structure comprising:
   a layer of light emitting diodes (LEDs) provided over a flexible substrate;
   a first conductor layer and a second conductor layer sandwiching the LEDs to connect the LEDs in parallel,
   the layer of LEDs, the first conductor layer, the second conductor layer, and the substrate comprising a flexible light sheet, wherein the LEDs are substantially randomly distributed on the first conductor layer; and
   an array of repeated molded 3-dimensional features in the light sheet achieving an optical effect, the molded features forming first 3-dimensional features on one side of the flexible light sheet and opposite 3-dimensional features on a reverse side of the flexible light sheet, wherein the features are not aligned with the LEDs,
   wherein portions of the light sheet that are distorted to have the 3-dimensional features contain a plurality of the LEDs, causing the LEDs within the 3-dimensional features to follow contours of the 3-dimensional features, such that the LEDs within the 3-dimensional features are not planar with respect to each other.

2. The structure of claim 1 wherein the features comprise a concave portion of the light sheet and an opposing convex portion of the light sheet.

3. The structure of claim 2 wherein light is emitted from the convex portion of the light sheet.

4. The structure of claim 2 wherein light is emitted from the concave portion of the light sheet.

5. The structure of claim 1 wherein an array of the features are formed by distorting the light sheet under pressure.

6. The structure of claim 1 wherein the features comprise bumps that widen a light emission profile of the light sheet.

7. The structure of claim 1 wherein the features comprise bumps that collimate light emitted by the light sheet.

8. The structure of claim 1 wherein the features comprise bumps that increase light extraction of the light sheet.

9. The structure of claim 1 wherein the features comprise a concave portion of the light sheet and an opposing convex portion of the light sheet, wherein the substrate is on the convex side and the layer of LEDs is on the concave side.

10. The structure of claim 1 wherein the features comprise a concave portion of the light sheet and an opposing convex portion of the light sheet, wherein the substrate is on the concave side and the layer of LEDs is on the convex side.

11. The structure of claim 1 wherein the features comprise a plurality of bumps formed in the light sheet.

12. The structure of claim 1 further comprising an opaque layer within the features, wherein the opaque layer is patterned to let light pass through openings in the opaque layer.

13. The structure of claim 12 wherein the openings form an alpha-numeric design.

14. The structure of claim 1 further comprising a capacitive touch sensor integrated with the light sheet.

15. The structure of claim 14 wherein the features correspond with touch sensor positions in the touch sensor.

16. The structure of claim 15 wherein the features identify the touch sensor positions.

17. The structure of claim 1 wherein the features are molded over the light sheet.

18. The structure of claim 1 further comprising a hardened material that covers at least a portion of the one or more features to retain a shape of the features.

19. A method for forming a light emitting structure comprising:
   providing a layer of light emitting diodes (LEDs) over a flexible substrate;
   providing a first conductor layer and a second conductor layer sandwiching the LEDs to connect the LEDs in parallel,
   the layer of LEDs, the first conductor layer, the second conductor layer, and the substrate comprising a flexible light sheet, wherein the LEDs are substantially randomly distributed on the first conductor layer; and
   distorting the light sheet by a mold to form 3-dimensional features in the light sheet to achieve an optical effect, the step of distorting the light sheet forming an array of repeated 3-dimensional features in the light sheet, the molded features forming first 3-dimensional features on one side of the flexible light sheet and opposite 3-dimensional features on a reverse side of the flexible light sheet, wherein the features are not aligned with the LEDs,
   wherein portions of the light sheet that are distorted to have the 3-dimensional features contain a plurality of the LEDs, causing the LEDs within the 3-dimensional features to follow contours of the 3-dimensional features, such that the LEDs within the 3-dimensional features are not planar with respect to each other.

20. The method of claim 19 wherein the step of distorting the light sheet by the mold forms a concave portion of the light sheet and an opposing convex portion of the light sheet.

* * * * *